Figure 1:
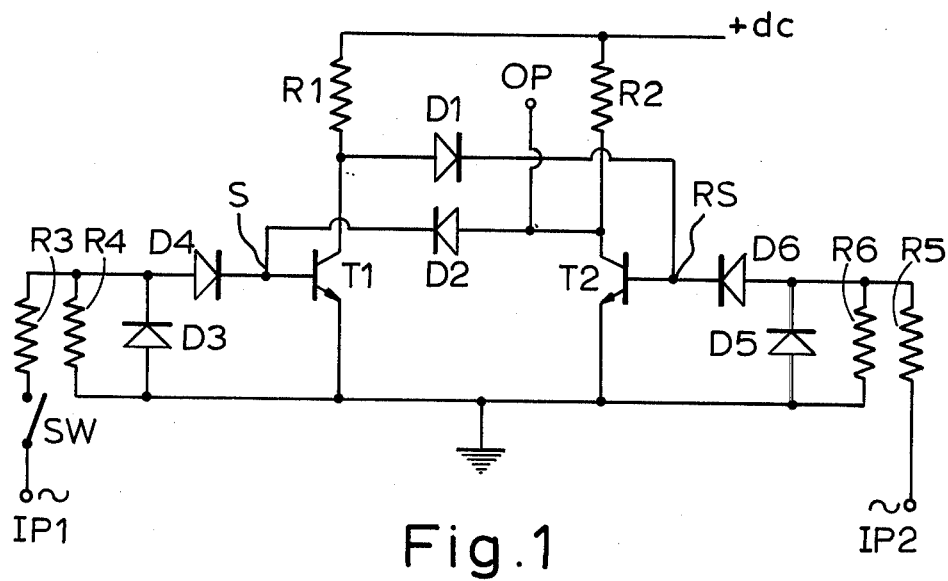

United States Patent [19]
Parkyn

[11] 4,085,342
[45] Apr. 18, 1978

[54] HIGH VOLTAGE A.C. TO LOW VOLTAGE D.C. SWITCHING INTERFACE CIRCUIT

[75] Inventor: Derek J. Parkyn, Westerham, England

[73] Assignee: U.S. Philips Corporation, New York, N.Y.

[21] Appl. No.: 736,854

[22] Filed: Oct. 29, 1976

[30] Foreign Application Priority Data

Nov. 3, 1975 United Kingdom ............... 45625/75

[51] Int. Cl.² ...................... H03K 17/00; H03K 3/286
[52] U.S. Cl. ................................ 307/260; 307/247 R; 307/291; 307/DIG. 1
[58] Field of Search ................. 307/291, 292, 247 R, 307/247 A, DIG. 1, 254, 260, 261; 328/195, 196, 206

[56] References Cited
U.S. PATENT DOCUMENTS

| | | | |
|---|---|---|---|
| 2,909,675 | 10/1959 | Edson | 307/292 X |
| 3,493,787 | 2/1970 | Russell | 307/247 X |

*Primary Examiner*—John Zazworsky
*Attorney, Agent, or Firm*—Frank R. Trifari; Bernard Franzblau

[57] ABSTRACT

An interface circuit for coupling a high voltage AC source to a bistable circuit for deriving a low voltage DC output signal at first and second voltage levels dependent on the condition of a switch. The AC voltage is coupled via the switch, a first voltage divider and first diode means to the set input of the bistable circuit and directly via a second voltage divider and second diode means to the reset input of the bistable circuit. The voltage ratios of the two dividers are chosen so that the bistable circuit is set and remains set when the switch is closed and is reset and remains reset when the switch is opened.

9 Claims, 7 Drawing Figures

HIGH VOLTAGE A.C. TO LOW VOLTAGE D.C. SWITCHING INTERFACE CIRCUIT

This invention relates to circuit arrangements for producing a low voltage DC output signal at a first or second level dependent on the closed or open condition respectively of a switch when the switch is connected to an a.c. high voltage source. Such circuit arrangements may form an interface between a high voltage switching circuit and an integrated circuit which may be employed, for example, for programming a domestic appliance such as a washing machine.

According to the invention there is provided a circuit arrangement for producing a low voltage DC output signal at a first or second level dependent on the closed or open condition respectively of a switch when the switch is connected to an a.c. high voltage source. A bistable circuit provides the output signal at the first or second level when it is in a respectively set or reset condition. A first pulse train generating circuit has said switch connected between its input, which is provided for connection to the a.c. source, and one end of a first potential divider. Diode elements are connected between a tap of the first potential divider and an output of the first pulse generating circuit which is connected to a set input of the bistable circuit. A second pulse generating circuit has one end of a second potential divider connected to its input, which is adapted for connection to the a.c. source, and diode elements connected between a tap of the second potential divider and an output of the second pulse generating circuit which is connected to a reset input of the bistable circuit. The two potential dividers have different potential ratios at the respective taps such that when the switch is changed from its open to its closed condition first and second pulse trains are applied respectively to the set and reset inputs of the bistable circuit. The pulses of both pulse trains have the duration of the same alternate half cycles of the a.c. source with the pulses of the first pulse train having steeper edges than the pulses of the second pulse train whereby the bistable circuit is set and remains set when the switch is in its closed condition. When the switch is changed from its closed to its open condition only the second pulse train is generated whereby the bistable circuit is reset and remains reset. The first and second pulse train generating circuits may each include two said diode elements which may be constituted by a transistor.

In a preferred embodiment of the invention, the two potential dividers each consist of two resistors, the resistor between said one end of each potential divider and its tap is formed as a discrete component, and the remainder of the circuit arrangement, other than the switch, is formed as an integrated circuit.

According to the invention, there is further provided a control arrangement for a domestic appliance, including $n$ switches, where $n$ is at least two, $n + 1$ discrete resistors, and an integrated circuit. The switches, discrete resistors and integrated circuit constitute $n$ circuit arrangements each as described in the previous paragraph wherein the discrete resistor of each circuit arrangement which is connected to its individual switch is constituted by an individual one of the $n + 1$ discrete resistors and the other discrete resistor of each circuit arrangement is constituted by a common one of the $n \times 1$ discrete resistors. The control arrangement also includes a programmer for operating each of the $n$ switches between its open and closed condition.

Figure 2A:
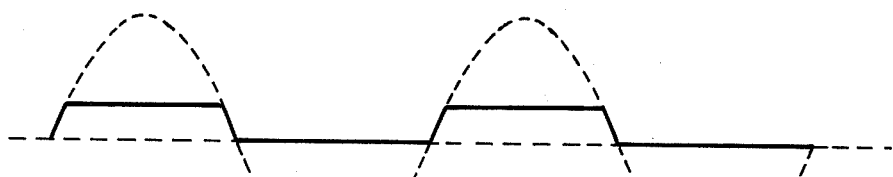
Figure 2B:
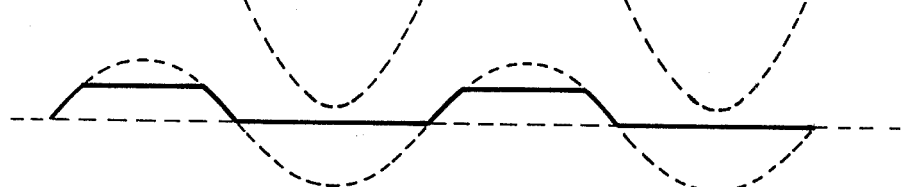
Figure 3:
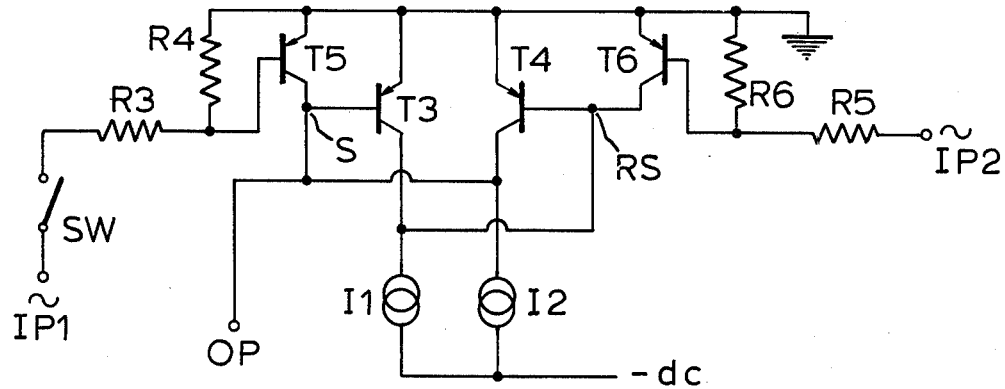
Figure 4A:
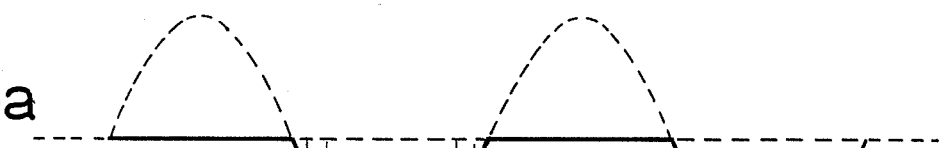
Figure 4B:
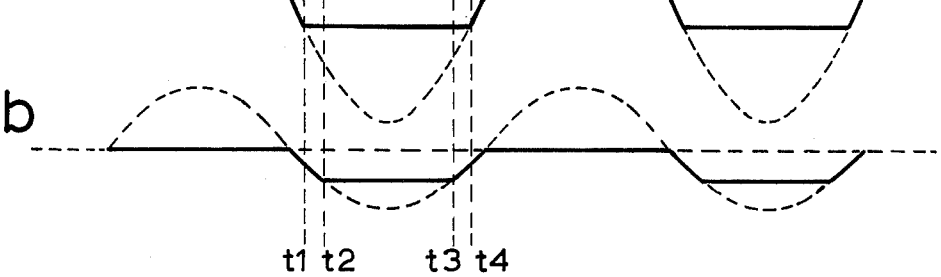
Figure 5:
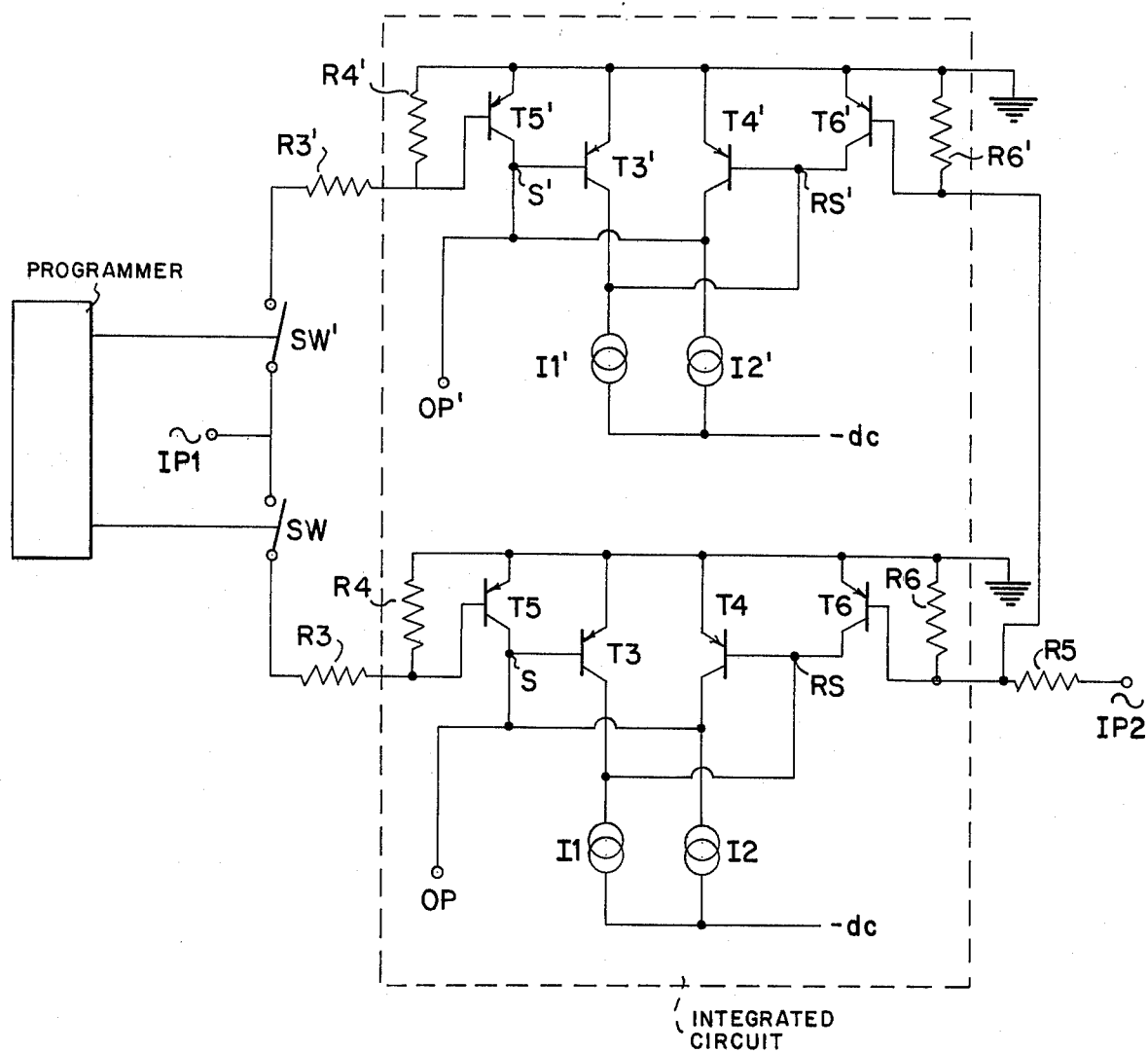

The invention will now be described in more detail with reference to the accompanying drawings, in which:

FIG. 1 shows a first circuit arrangement according to the invention,

FIGS. 2(a) and 2(b) show waveforms which illustrate the operation of the circuit arrangement of FIG. 1, FIG. 3 shows a second circuit arrangement according to the invention, FIGS. 4(a) and 4(b) show waveforms which illustrate the operation of the circuit arrangement of FIG. 3, and FIG. 5 shows a control arrangement according to the invention suitable for use in a domestic appliance.

Referring now to FIG. 1, two n-p-n transistors T1 and T2 have their emitters connected to ground potential, their collectors connected via respective resistors R1 and R2 to a positive d.c. low voltage source, and are cross-coupled via diodes D1 and D2 to form a bistable circuit having a set input S at the base of transistor T1 and a reset input RS at the base of transistor T2. An output OP at the collector of the transistor T2 provides a low voltage DC output signal at a first level when the bistable circuit is in a set condition and a low voltage DC output signal at a second level when the bistable circuit is in a reset condition. A first pulse train generating circuit has a switch SW between its input IP1, which is provided for connection to an a.c. high voltage source, e.g., 240 volts 50 Hz line voltage, and one end of a potential divider consisting of two resistors R3 and R4. The other end of the potential divider R3, R4 is connected to ground potential. Two diodes D3 and D4 are arranged between the low voltage tap of the potential divider R3, R4 and the output of the first pulse train generating circuit which is connected to the set input S of the bistable circuit at the base of the transistor T1. The diode D3 has its anode connected to ground potential and its cathode connected to the tap on the potential divider R3, R4 and the diode D4 has its anode connected to the tap on the potential divider R3, R4 and its cathode connected to the set input S of the bistable circuit. A second pulse train generating circuit has a potential divider consisting of two resistors R5 and R6. One end of the potential divider is permanently connected to the input IP2 of the second pulse train generating circuit, which is adapted for connection to the same a.c. high voltage source which is to be connected to the input IP1. The other end of the potential divider R5, R6 is connected to ground potential. Two diodes D5 and D6 are arranged between the low voltage tap of the potential divider R5, R6 and the output of the second pulse train generating circuit which is connected to the reset input RS of the bistable circuit at the base of the transistor T2. The diode D5 has its anode connected to ground potential and its cathode connected to the tap on the potential divider R5, R6 and the diode D6 has its cathode connected to the reset input RS of the bistable circuit.

The two potential dividers have different potential ratios at their respective taps, that is to say that $R4/(R3 + R4)$ is greater than $R6/(R5 + R6)$. Thus if the resistors R3, R4, R5 and R6 have the values 220KΩ, 4KΩ, 220KΩ and 2KΩ respectively, then when the switch SW is closed the potential waveforms which would be present at the taps of the dividers R3, R4 and R5, R6 respectively in the absence of the diodes D3, D4, D5 and D6 are shown by the dotted outlines in FIGS. 2(a)

and 2(b) respectively. Both dotted outline waveforms are sinusoidal waveforms at the frequency of and in phase with the a.c. source. If the a.c. source has 240 volts peak voltage and the resistors R3, R4, R5 and R6 have the just quoted values, then the waveforms of FIGS. 2(a) and 2(b) have peak values of approximately 4 volts and 2 volts respectively. The function of the diodes D3, D4, D5 and D6 is to produce a first pulse train of positive pulses at the set input S and a second pulse train of equal amplitude positive pulses at the reset input RS as shown by the full outlines of FIGS. 2(a) and 2(b) respectively. Thus the pulses of both pulse trains have the duration of the positive half cycles of the a.c. source with the pulses of the first pulse train applied to the set input S (FIG. 2(a)) having steeper edges than the pulses of the second pulse train applied to the reset input RS (FIG. 2(b)).

Thus when the switch SW is changed from its open to its closed condition both pulse trains are generated but the first pulse train at the set input S overrides the second pulse train at the reset input RS so that the bistable circuit is set within 1 cycle of the a.c. source and remains set. A low voltage DC output signal at a first level is then continuously provided at the collector of the transistor T2 corresponding to the transistor T1 being switched on and the transistor T2 being switched off. When the switch SW is changed from its closed to its open condition only the second pulse train at the reset input RS is generated so that the bistable circuit is reset within one cycle of the a.c. source and remains reset. A low voltage DC signal at a second level is then continuously provided at the collector of the transistor T2 corresponding to the transistor T1 being switched off and the transistor T2 being switched on.

Referring now to FIG. 3, two p-n-p transistors T3 and T4 have their emitters connected to ground potential, their collectors connected via respective current sources I1 and I2 to a negative d.c. low voltage source, and are directly cross-coupled to form a bistable circuit having a set input S at the base of transistor T3 and a reset input RS at the base of transistor T4. An output OP at the collector of the transistor T4 provides a low voltage DC output signal at a first level when the bistable circuit is in a set condition and a low voltage DC output signal at a second level when the bistable circuit is in a reset condition. A first pulse train generating circuit has a switch SW between its input IP1, which is provided for connection to an a.c. high voltage source, e.g., 240 volts 50 Hz line voltage, and one end of a potential divider consisting of two resistors R3 and R4. The other end of the potential divider R3, R4 is connected to ground potential. An n-p-n transistor T5 is arranged between the low voltage tap on the potential divider R3, R4 and the output of the first pulse train generating circuit which is connected to the set input S of the bistable circuit at the base of the transistor T3. The transistor T5 has its emitter connected to ground potential, its base connected to the tap on the potential divider R3, R4 and its collector connected to the set input S of the bistable circuit. A second pulse train generating circuit has a potential divider consisting of two resistors R5 and R6. One end of the potential divider is permanently connected to the input IP2 of the second pulse train generating circuit, which is adapted for connection to the same a.c. high voltage source which is to be connected to the input IP1. The other end of the potential divider R5, R6 is connected to ground potential. An n-p-n transistor T6 is arranged between the low voltage tap of the potential divider R5, R6 and the output of the second pulse train generating circuit which is connected to the reset input RS of the bistable circuit at the base of the transistor T4. The transistor T6 has its emitter connected to ground potential, its base connected to the tap of the potential divider R5, R6 and its collector connected to the reset input RS of the bistable circuit.

The two potential dividers have different potential ratios at the respective taps, that is to say that R4/(R3 + R4) is greater than R6/(R5 + R6). Thus if the resistors R3, R4, R5 and R6 have the values 220KΩ, 4KΩ, 220KΩ and 2KΩ respectively, then when the switch SW is closed the potential waveforms which would be present at the taps of the dividers R3, R4 and R5, R6 respectively in the absence of the transistors T5 and T6 are shown by the dotted outlines in FIGS. 4(a) and 4(b) respectively. Both dotted outline waveforms are sinusoidal waveforms at the frequency of and in phase with the a.c. source. If the a.c. source has 240 volts peak voltage and the resistors R3, R4, R5 and R6 have the just quoted values, then the waveforms of FIGS. 4(a) and 4(b) have peak values of approximately 4 volts and 2 volts respectively. The function of the diodes of the transistors T5 and T6 is to produce a first pulse train of negative pulses at the set input S and a second pulse train of equal amplitude negative pulses at the reset input RS as shown by the full outlines of FIGS. 4(a) and 4(b) respectively. Thus the pulses of both pulse trains have the duration of the negative half cycles of the a.c. source with the pulses of the first pulse train applied to the set input S (FIG. 4(a)) having steeper edges than the pulses of the second pulse train applied to the reset input RS (FIG. 4(b)).

Considering a negative half cycle of the a.c. source when the switch SW is closed, at time t1 the transistor T5 is in control of the bistable circuit and will change its state if required. At time t2 the transistor T6 will override the collector of the transistor T3 but the output at the collector of transistor T4 is already determined by the output of transistor T5. At time t3 the collector of transistor T3 is again allowed to take up the bistable state dictated by the output of the transistor T5. At time t4 the transistor T5 turns off and the bistable circuit remains set.

Thus when the switch SW is changed from its open to its closed condition both pulse trains are generated but the first pulse train at the set input S overrides the second pulse train at the reset input RS so that the bistable circuit is set within one cycle of the a.c. source and remains set. A d.c. low voltage output signal at a first level is then continuously provided at the collector of the transistor T4 corresponding to the transistor T3 being switched off and the transistor T4 being switched on. When the switch SW is changed from its closed to its open condition only the second pulse train at the reset input RS is generated so that the bistable circuit is reset within one cycle of the a.c. source and remains reset. A d.c. low voltage signal at a second level is then continuously provided at the collector of the transistor T4 corresponding to the transistor T3 being switched on and the transistor T4 being switched off.

An advantageous realization of both the circuit arrangements shown in FIGS. 1 and 3 is to provide the resistors R3 and R5 as discrete components and to form the remainder of the circuit arrangement, other than the switch SW, as an integrated circuit. The circuit arrangement thus forms an interface between a high voltage switching circuit and an integrated circuit. This realization can be conveniently extended to accommodate more than one switch by extending the integrated circuit and providing one more discrete resistor for each switch. Thus there can be formed a control arrangement as shown in FIG. 5 including $n$ switches, where $n$ is at least two, $n + 1$ discrete resistors, and an integrated circuit. The switches, discrete resistors and integrated circuit constituting $n$ circuit arrangements are each as shown in FIG. 1 or FIG. 3 wherein the discrete resistor of each circuit arrangement which is connected to its individual switch is constituted by an individual one of the $n + 1$ discrete resistors and the other discrete resistor of each circuit arrangement is constituted by a common one of the $n + 1$ discrete resistors. The control arrangement also includes a programmer for operating each of the $n$ switches between its open and closed condition. Such a control arrangement is useful for programming a domestic appliance such as a washing machine, a dishwasher, a cooker, or a central heating system.

What we claim is:

1. A circuit arrangement for producing a low voltage DC output signal at a first or second level dependent on the closed or open condition of a switch comprising, means connecting the switch to a high voltage AC source, a bistable circuit which provides the output signal at the first or second level when it is in a set or reset condition, respectively a first pulse train generating circuit having an input for connection to the a.c. source and a first potential divider, means connecting said switch between said input and one end of said first potential divider, diode elements connected between a tap on the first potential divider and an output of the first pulse generating circuit which is connected to a set input of the bistable circuit, a second pulse generating circuit having a second input for connection to the AC source and a second potential divider with one end of the second potential divider connected to the second input, and further diode elements connected between a tap on the second potential divider and an output of the second pulse generating circuit which is connected to a reset input of the bistable circuit, the two potential dividers having different potential ratios at their respective taps such that when the switch is changed from its open to its closed condition first and second pulse trains are applied respectively to the set and reset inputs of the bistable circuit, the pulses of both pulse trains having the duration of the same alternate half cycles of the a.c. source with the pulses of the first pulse train having steeper edges than the pulses of the second pulse train whereby the bistable circuit is set and remains set, only the second pulse train being generated when the switch is changed from its closed to its open condition whereby the bistable circuit is reset and remains reset.

2. A circuit arrangement as claimed in claim 1, in which the first and second pulse train generating circuits each include two said diode elements which are each constituted by a transistor.

3. A circuit arrangement as claimed in claim 1, in which the two potential dividers each comprise two resistors, the resistor between said one end of each potential divider and its tap being formed as a discrete component, and in which the remainder of the circuit arrangement, other than the switch, is formed as an integrated circuit.

4. A circuit arrangement as claimed in claim 3 comprising $n$ switches, where $n$ is at least two, $n + 1$ discrete resistors, and an integrated circuit, the switches, discrete resistors and integrated circuit constituting $n$ circuit arrangements each as claimed in claim 3, and a programmer for operating each of the $n$ switches between its open and closed condition.

5. An interface circuit comprising, a terminal for connecting a source of AC voltage to the circuit, a switch having an open and closed state, a bistable circuit having set and reset inputs and an output for deriving a low level DC output signal at a first or second level determined by the state of the switch, first and second voltage dividers having first and second input terminals, respectively, and first and second taps, respectively, means connecting said first input terminal to said AC connecting terminal via said switch and said second terminal directly to the AC connecting terminal, and first and second diode means coupling said first and second voltage divider taps to the set and reset inputs of the bistable circuit respectively so as to clip off the tops of an Ac waveform signal applied to said voltage dividers, said first and second voltage dividers producing different voltage levels at their respective taps such that when the switch is in its closed state first and second clipped voltage waveforms are simultaneously applied to the set and reset inputs respectively of the bistable circuit but with the first waveform having steeper edges than the second waveform whereby the bistable circuit is driven into its set state and remains set while the switch is closed, the open state of the switch removing the AC voltage from the first voltage divider so that the second voltage waveform only is then applied to the reset input of the bistable circuit which is thereby driven into its reset state and remains reset while the switch is open.

6. An interface circuit as claimed in claim 5 wherein said bistable circuit comprises first and second transistors having their base and collector electrodes cross-coupled by first and second diodes.

7. An interface circuit as claimed in claim 5 wherein the ends of said first and second voltage dividers are connected to a point of reference voltage and said first and second diode means each comprise first and second diodes serially connected with the same polarity between said point of reference voltage and the set and reset inputs, respectively, of the bistable circuit, and means connecting the junction points of each of said first and second diodes to said first and second voltage divider taps, respectively.

8. An interface circuit as claimed in claim 5 wherein said bistable circuit comprises first and second transistors individually connected in series with first and second current sources across the supply terminals of a source of DC voltage, and said first and second diode means comprise third and fourth transistors coupling said first and second voltage divider taps to the respective control electrodes of said first and second transistors which constitute the set and reset inputs of the bistable circuit.

9. An interface circuit as claimed in claim 5 wherein each voltage divider comprises first and second series connected resistors with each first resistor being connected between its respective input terminal and its tap and being formed as a discrete resistor component, and wherein the second resistors, the bistable circuit and the first and second diode means are all formed as a single integrated circuit.

* * * * *